(12) United States Patent
Menon et al.

(10) Patent No.: US 7,313,739 B2
(45) Date of Patent: Dec. 25, 2007

(54) METHOD AND APPARATUS FOR TESTING EMBEDDED CORES

(75) Inventors: Sankaran M. Menon, Austin, TX (US); Luis A. Basto, Austin, TX (US); Tien Dinh, Cedar Park, TX (US); Thomas Tomazin, Austin, TX (US); Juan G. Revilla, Austin, TX (US)

(73) Assignee: Analog Devices, Inc., Norwood, MA (US)

( * ) Notice: Subject to any disclaimer, the term of this patent is extended or adjusted under 35 U.S.C. 154(b) by 131 days.

(21) Appl. No.: 10/335,149

(22) Filed: Dec. 31, 2002

(65) Prior Publication Data

US 2004/0128596 A1 Jul. 1, 2004

(51) Int. Cl.
*G11C 29/00* (2006.01)

(52) U.S. Cl. .................. 714/718; 714/8; 714/25; 714/30; 714/42; 714/718; 714/723; 714/733; 714/734; 365/201

(58) Field of Classification Search .................. 714/30, 714/718
See application file for complete search history.

(56) References Cited

U.S. PATENT DOCUMENTS

| | | | | |
|---|---|---|---|---|
| 5,062,109 A | * | 10/1991 | Ohshima et al. | 714/719 |
| 5,173,906 A | * | 12/1992 | Dreibelbis et al. | 714/733 |
| 5,748,640 A | * | 5/1998 | Jiang et al. | 714/720 |
| 6,519,725 B1 | * | 2/2003 | Huisman et al. | 714/718 |
| 6,530,052 B1 | * | 3/2003 | Khou et al. | 714/733 |
| 6,622,269 B1 | * | 9/2003 | Ngo et al. | 714/718 |
| 6,643,807 B1 | * | 11/2003 | Heaslip et al. | 714/719 |
| 6,691,252 B2 | * | 2/2004 | Hughes et al. | 714/30 |
| 6,694,461 B1 | * | 2/2004 | Treuer | 714/719 |
| 7,143,326 B2 | * | 11/2006 | Fan et al. | 714/738 |
| 2002/0059543 A1 | * | 5/2002 | Cheng et al. | 714/30 |
| 2002/0157051 A1 | * | 10/2002 | Eckelman et al. | 714/736 |
| 2004/0073841 A1 | * | 4/2004 | Toros et al. | 714/30 |

OTHER PUBLICATIONS

Huang et al., "A High-Speed Built-in-Self-Test Design for DRAMs", Jun. 8-10, 1999, IEEE VLSI Technology, Systems, and Applications Symposium, pp. 50-53.*

Tehranipour et al., "Zero-Overhead BIST for Internal-SRAM Testing", Oct. 31-Nov. 2, 2000, IEEE Microelectronics Proceeedings, pp. 109-112.*

* cited by examiner

*Primary Examiner*—Cynthia Britt
*Assistant Examiner*—John P Trimmings
(74) *Attorney, Agent, or Firm*—Fish & Richardson P.C.

(57) ABSTRACT

Testing memory devices. An apparatus may include a test module operative to perform a test on a plurality of pipelined memory elements and a fail trace module operative to interrupt the test in response to identifying a failure of a memory element and to store an address of said memory element in a storage unit.

20 Claims, 11 Drawing Sheets

METHOD AND APPARATUS FOR TESTING EMBEDDED CORES

BACKGROUND

A multi-chip system may include one or more printed circuit boards with multiple integrated circuits (ICs). In a System-on-Chip (SoC), a system may be integrated into a single IC. An SoC may offer advantages such as higher performance, lower power consumption, and smaller volume and weight, when compared to a multi-chip system.

An SoC may include a number of embedded cores and memory arrays. The inputs to an embedded core, e.g., the core terminals, may not be directly connected to pins on the SoC. The lack of direct access to an embedded core's terminals may complicate testing of the embedded core. A test access mechanism may be used to link a test pattern source to an embedded core's input terminals and to link the embedded core's output terminals to a test pattern sink.

DETAILED DESCRIPTION

Figure 1:
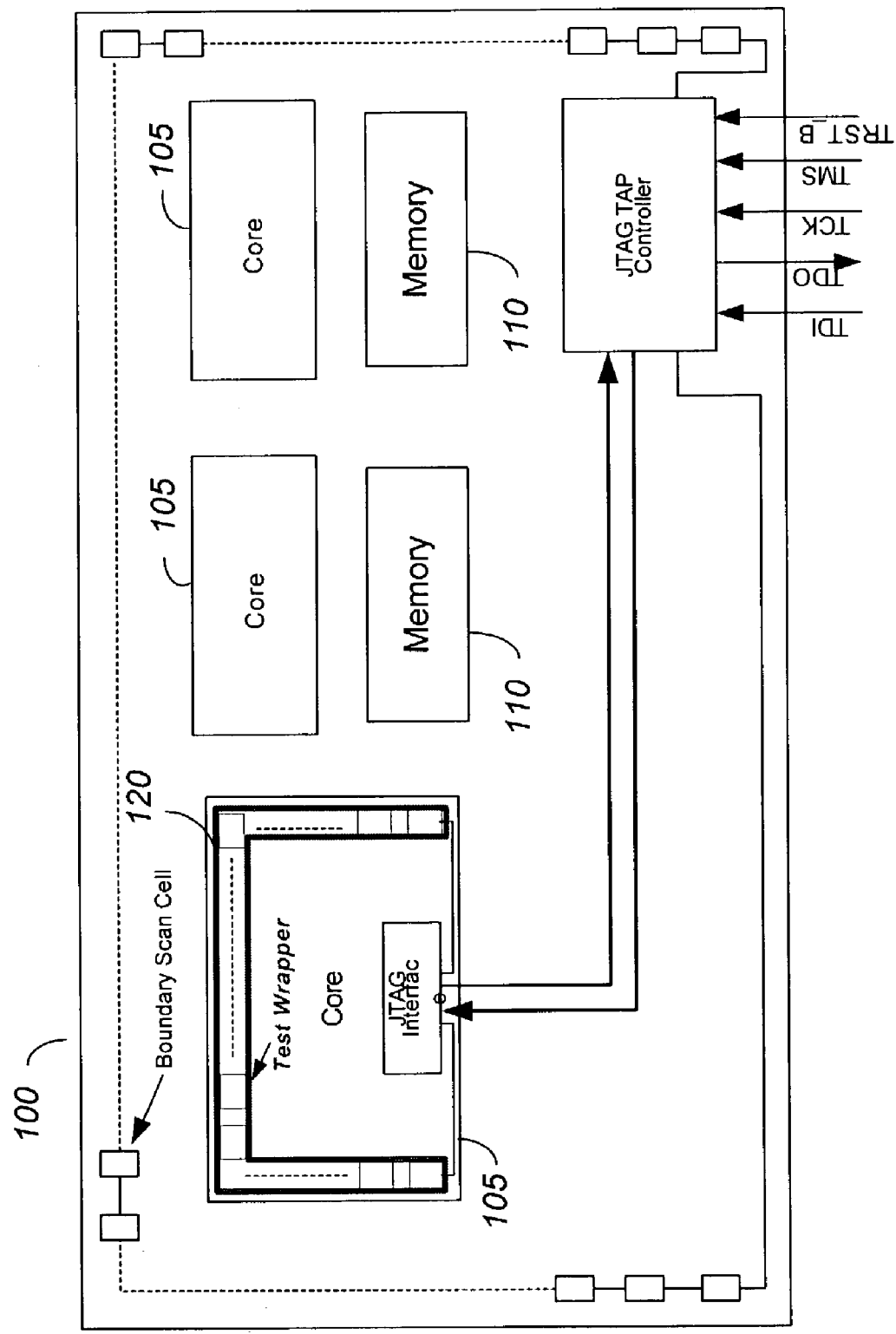
FIG. 1 is a block diagram of a System-on-Chip (SoC).
Figure 2:
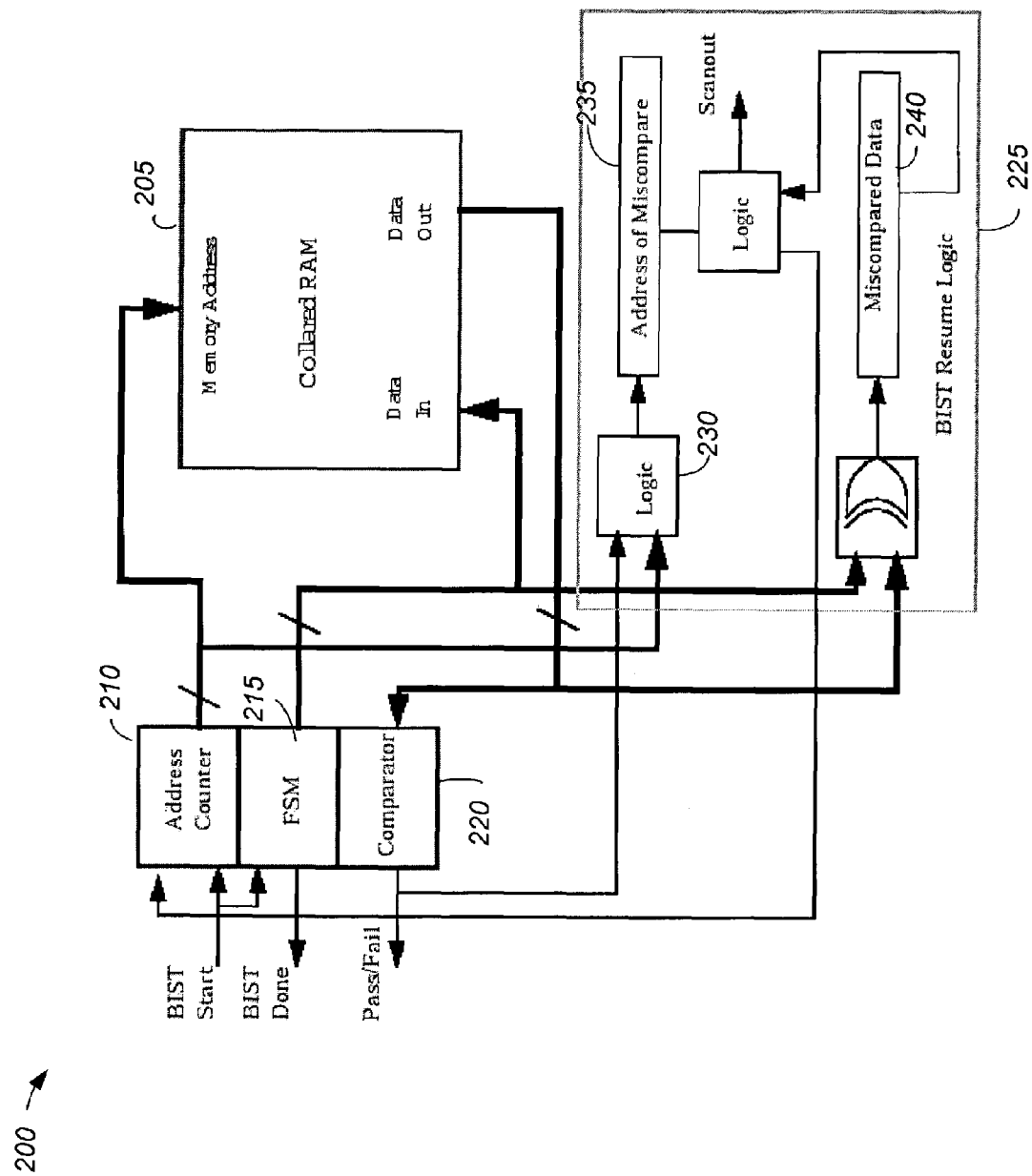
FIG. 2 is a block diagram of a Built-In Self Test (BIST) controller.

FIG. 1 illustrates a system 100 according to an embodiment. The system may be a System-on-a-Chip (SoC) including a number of embedded cores 105 and memories 110. The embedded memories 110 may be tested using a Built-In Self Test (BIST) technique. A BIST controller 200, shown in FIG. 2, may be used to perform a BIST operation on a test-collared memory 205. The BIST controller 200 may include an address counter 210, a pattern generator/finite state machine (FSM) 215 to generate test patterns and sequence the test, and a comparator 220 to compare the written data with the data read from the memory.

The BIST controller 200 may be operated in a "Pass/Fail" mode in which a March algorithm is used to test addresses, data locations, and address decoders for failure mechanisms. The failure mechanisms may include memory bit stuck-at faults, shorts between bit lines, shorts between word lines, coupling faults, pattern sensitive faults and linked faults. In the Pass/Fail mode, if a failure occurs, failure information may be logged, but may not provide the location of the fault.

Figure 3:
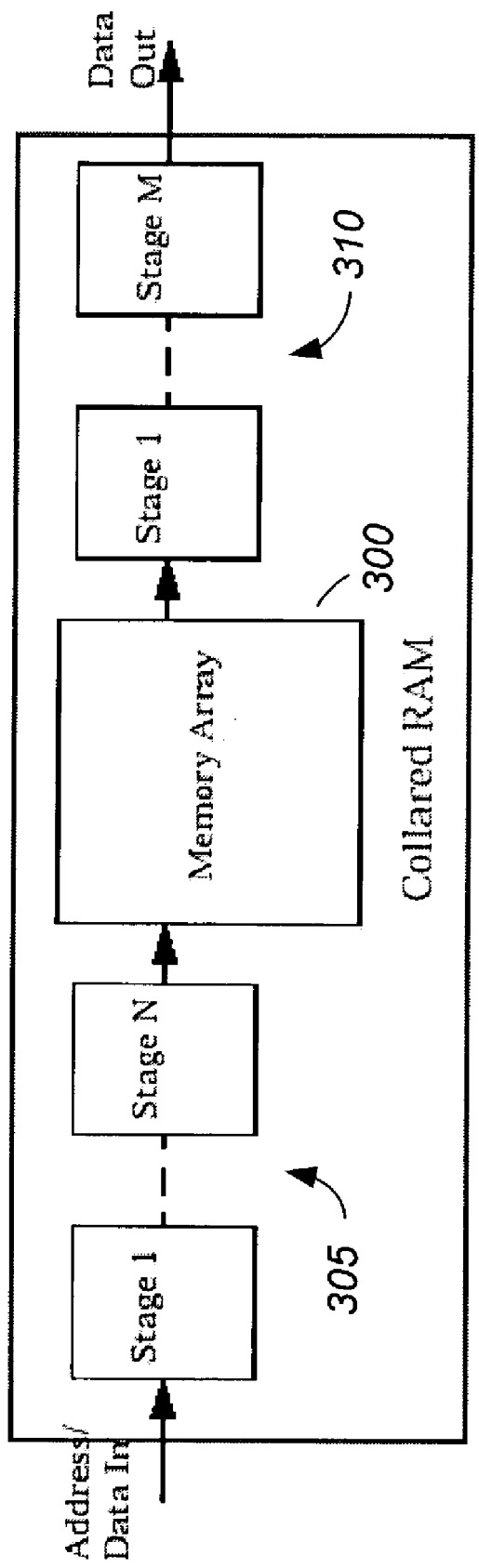
FIG. 3 is a block diagram of a pipelined memory array.

Embedded cores and memory arrays may have pipelined architectures. FIG. 3 shows a pipelined memory array with N input stages 305 and M output stages 310. After a valid address issues, data may take N clock cycles to be written into the memory array for a write cycle and M clock cycles to be read out for a read operation.

The pipeline staging may introduce timing latencies. The timing latencies may cause the information about failure in consecutive locations to be lost. The loss of information due to pipeline staging may diminish the debug capability for embedded memory BIST.

The BIST controller 200 may include a fail trace buffer 225 to be used in an alternative "Resume" mode. In the Resume mode, the fail trace buffer may be used to log information about the location of faults, which may prevent loss of information due to pipeline staging in an embedded memory. When a BIST failure occurs, control logic 230 may stop the BIST operation, and the corresponding address may be latched into an address miscompare register 235 with a failure flag. The data corresponding to the failed location may be latched into a miscompared data register 240, although the scope of the present invention is not limited in this respect. The control logic 230 may then increment the address counter 210 by one and restart the BIST operation at the point where the operation stopped. Testing may continue normally until the next failure. This sequence may be repeated until the test is complete. The information in the registers may be incorporated into a bitmap of failures in the memory. This failure information may be useful in manufacturing and process debug operations.

A March algorithm which may be used with a non-pipelined memory array may have the following sequence M0: >w0
M1: >(r0w1)
M2: <(r1w0r0)

where M[0, 1, 2] are three March states and
r0=read true data
r1=read complementary data
w0=write true data
w1=write complementary data
>=operation in ascending order (0 to N−1)
<=operation in descending order (N−1 to 0)

In state M0, the BIST controller 200 may write true data in a cell and then increment the counter to the next cell until the memory array is filled with true data pattern. In state M1, the BIST controller 200 may read the true data in a cell, and if no failure is detected, write the complement of the true data in the cell and increment the counter to the next cell. This read/write operation may be repeated until the memory array is filled with complementary data. In state M2, the BIST controller 200 may, beginning from the last cell in the array, read the complementary data in a cell, write the true data for the cell, read the true data, and if no failure is detected, decrement the counter. This operation may be repeated until the memory array is filled with true data. While this March algorithm may be sufficient for non-pipelined architectures, the algorithm may not compensate for timing latencies due to pipeline staging.

A BIST controller, e.g., the BIST controller 200 or a BIST controller which may not support the Resume mode, may compensate for the pipeline staging by inserting redundant write cycles in a March algorithm, although the scope of the present invention is not limited in this respect. The BIST controller 200 may perform a March algorithm having the following sequence for a pipeline with two stages:

M0: >w0
M1: >(w0r0w1)
M2: <(w1r1w0r0)

Redundant read cycles may also achieve the same functionality. Hence, the sequence shown above can be modified to include redundant reads.

Figure 4A:
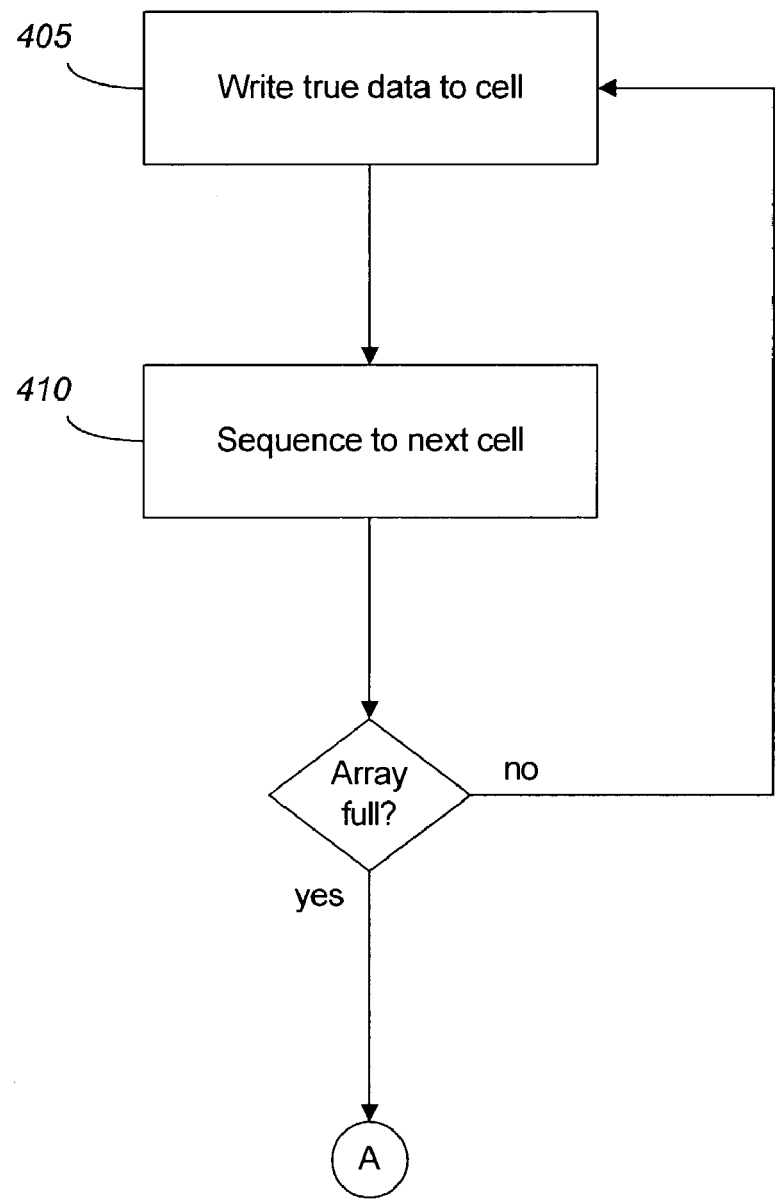
FIG. 4 is a flowchart describing a BIST operation for a pipelined architecture.
Figure 4B:
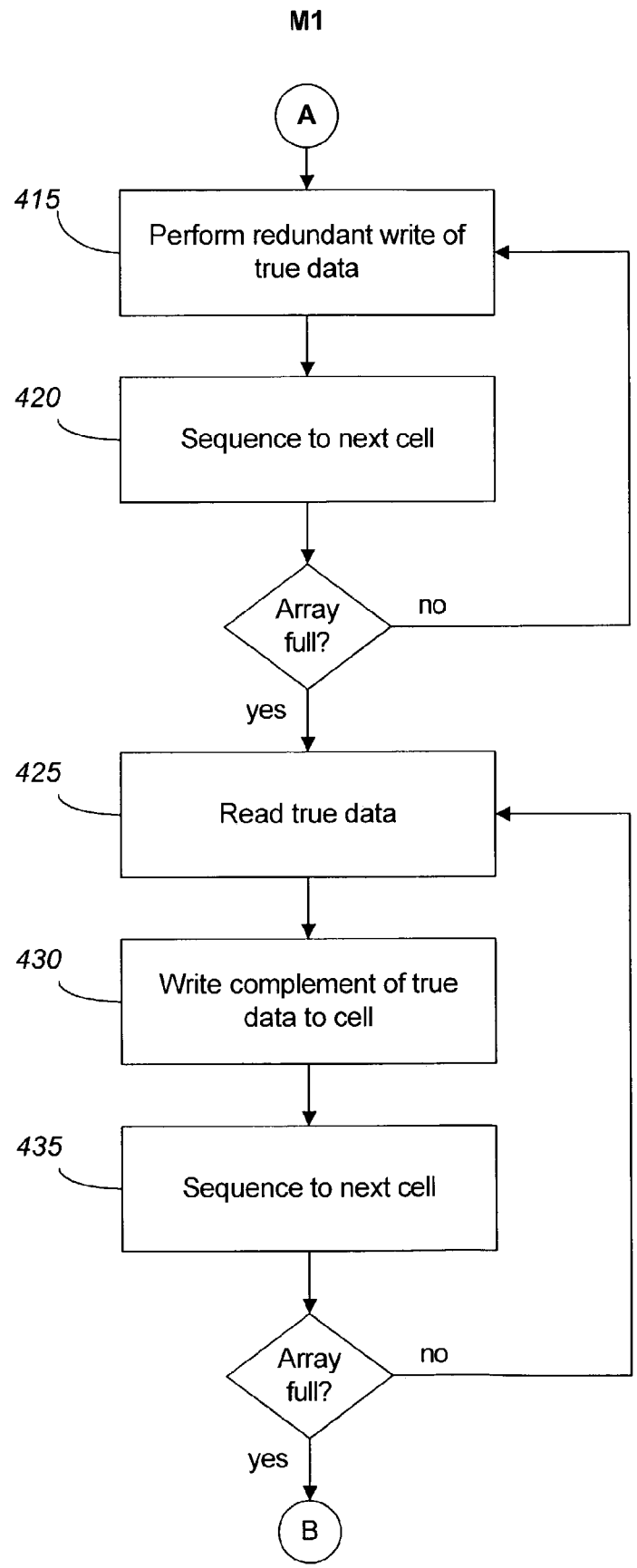
Figure 4C:
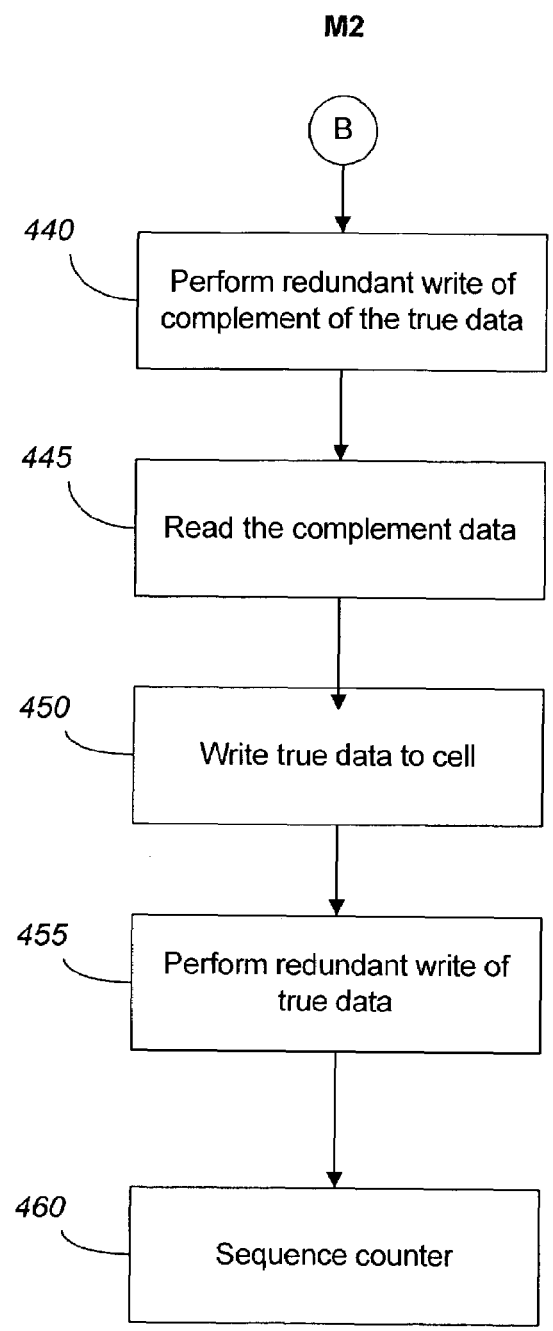

For the two-stage example described above, a redundant write cycle may be added for a read cycle. FIG. 4 shows a flowchart describing a BIST operation 400 according to an embodiment. In state M0, the BIST controller may write true data in a cell (block 405) and then increment the counter to the next cell (block 410) until the memory array is filled with true data pattern. In state M1, the BIST controller may perform a redundant write cycle (block 415), writing again the true data in a cell and then incrementing the counter (block 420) until the memory array is filled with true data. The BIST controller may then read the true data in a cell (block 425), and if no failure is detected, write the complement of the true data in the cell (block 430) and increment the counter to the next cell (block 435). In state M2, the BIST controller may perform a redundant write cycle, writing again the complement of the true data (block 440), read the complement data (block 445), write the true data (block 450), perform a redundant write cycle, writing again the true data (block 455), and if no failure is detected, decrement the counter (block 460). This operation may be repeated until the memory array is filled with true data.

The redundant write cycles may introduce timing latencies into the March algorithm, which may compensate for timing latencies introduced by the pipeline staging. Since the redundant write cycle may write what was written in the write cycle immediately preceding it, the test information may be preserved. The general form of the algorithm may be extended to $(wx^{n-1}rx)$ where "n" is the number of pipeline stages and "x" is the true or complement data being tested.

Figure 5:
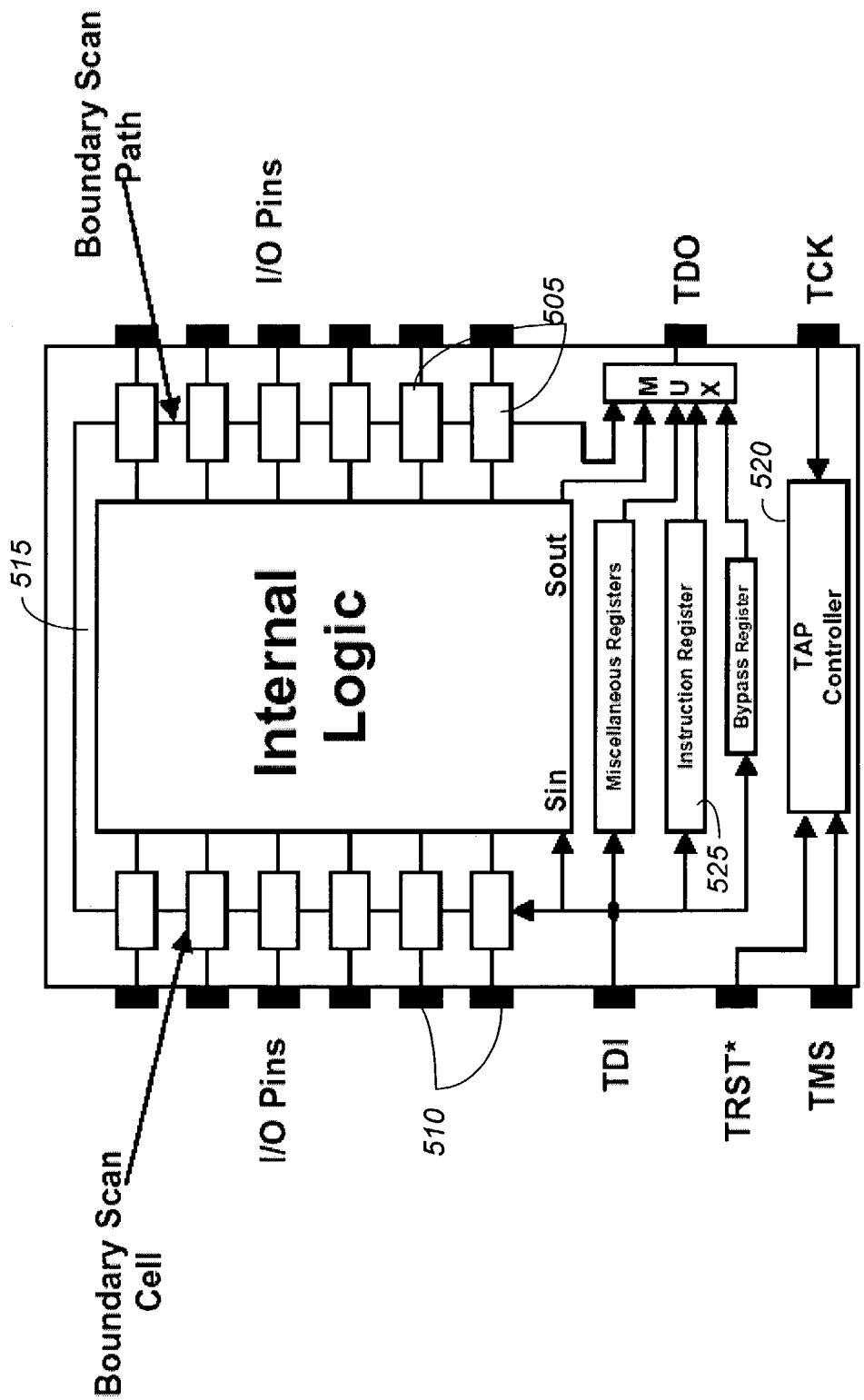
FIG. 5 is a block diagram of a boundary scan test architecture.

A JTAG (Joint Test Access Group) boundary scan test (BST) (described in the IEEE standard 1149.1, approved February 1990) may be used to test an embedded core. A BST cell 505 may be added to a I/O pad 510, e.g., a pin in the SoC package or a functional terminal on an embedded core, as shown in FIG. 5. During standard operations, BST cells 505 may be inactive and allow data to propagate through the device normally. During test modes, the BST cell 505 may capture input and output signals.

The operation of the BST cells 505 may be controlled through a BST interface, e.g., a test access port (TAP) controller 520, and an instruction register 525, which may hold a BST instruction and provide control signals. The BST cells may be joined together to form a scan chain and create a boundary-scan shift register (BSR).

The TAP controller 520 may use four signals: TDI (test-data input), TDO (test-data output), TCK (test clock), and TMS (test mode select). These four signals may be connected to the TAP controller inside the core. The TAP controller may be a state machine clocked on the rising edge of TCK, and state transitions may be controlled by the TMS signal.

Figure 6:
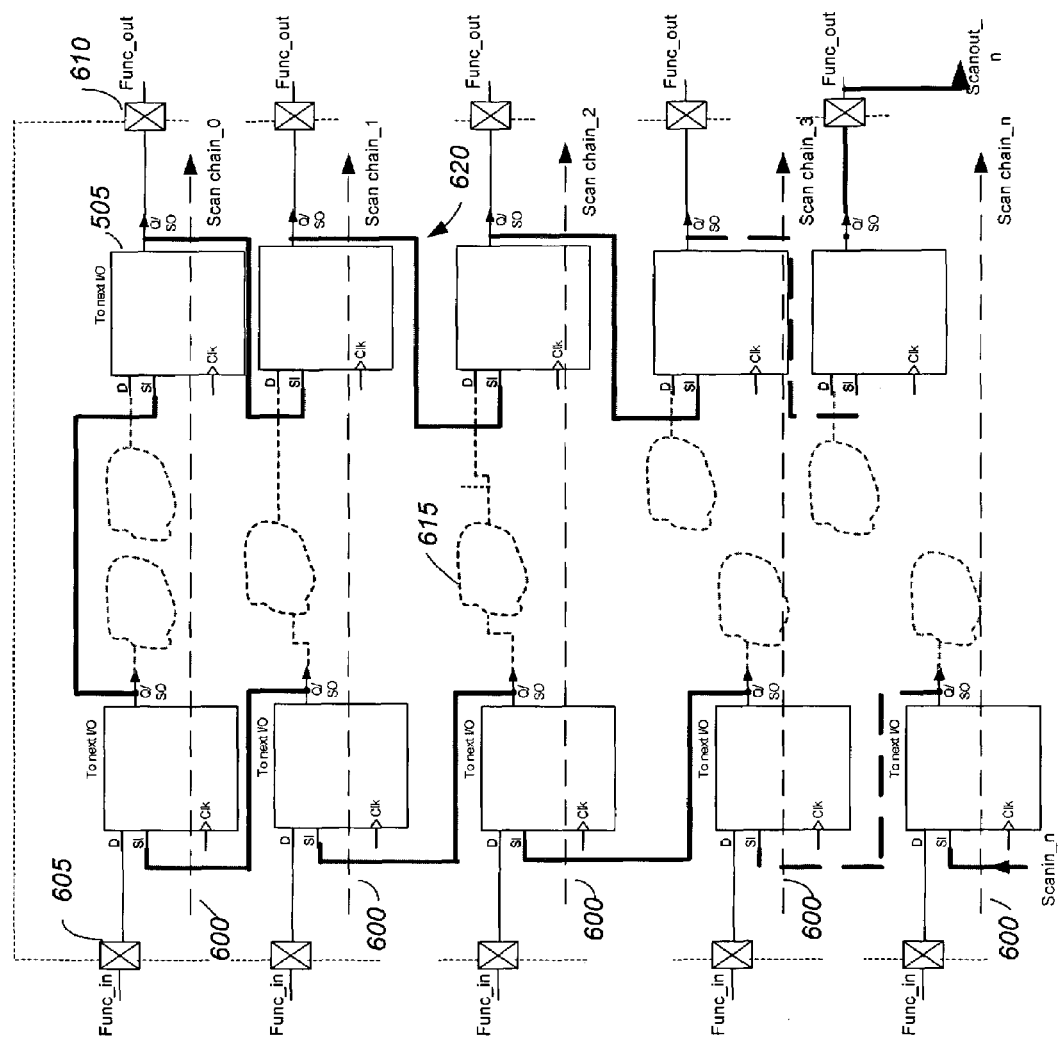
FIG. 6 is a schematic diagram of a core test wrapper.

An embedded core may include a number of parallel scan chains 600, e.g., scan chains [0 . . . n] shown in FIG. 6. The scan chains may be tested in parallel, which may improve test time. A BST cell may be provided at an input function terminal 605 and another BST cell at an output function terminal 610. The input BST cell and the output BST cell may be separated by logic 615 in the core to be tested. For example, data may be shifted into or out of scan chains to initialize internal registers or read out captured values, respectively.

Some of the functional terminals in the embedded core may not be directly connected to pins in the SoC package. These terminals may not be directly controllable or observable. This may complicate access to the core, which may in turn complicate test isolation of the core and negatively impact fault coverage.

A scan chain 600 including primary (e.g., controllable) core terminals may be re-routed to form a boundary scan chain 620 around the embedded core. The boundary scan chain 620 may be created by linking the scan output (SO) of a BST cell in a scan chain to an input (SI) of a scan cell in an adjacent scan chain. This may improve the fault coverage of the scan chains by providing access to all of the linked input scan cells and output scan cells through the primary terminals, although the scope of the present invention is not limited in this respect.

The boundary scan chain 620 may extend around the boundary of the embedded core. The boundary scan chain may be used as a test wrapper 120 to isolate the core 105 for testing, as shown in FIG. 1. A boundary scan pattern (e.g., a JTAG boundary scan pattern) may be applied through the test wrapper 120. Multiple embedded cores in the SoC may be isolated with different test wrappers, although the scope of the present invention is not limited in this respect. The BST cells in the test wrapper may be selected from BST cells in parallel scan chains, as shown in FIG. 6, or may be dedicated test wrapper BST cells.

Figure 7:
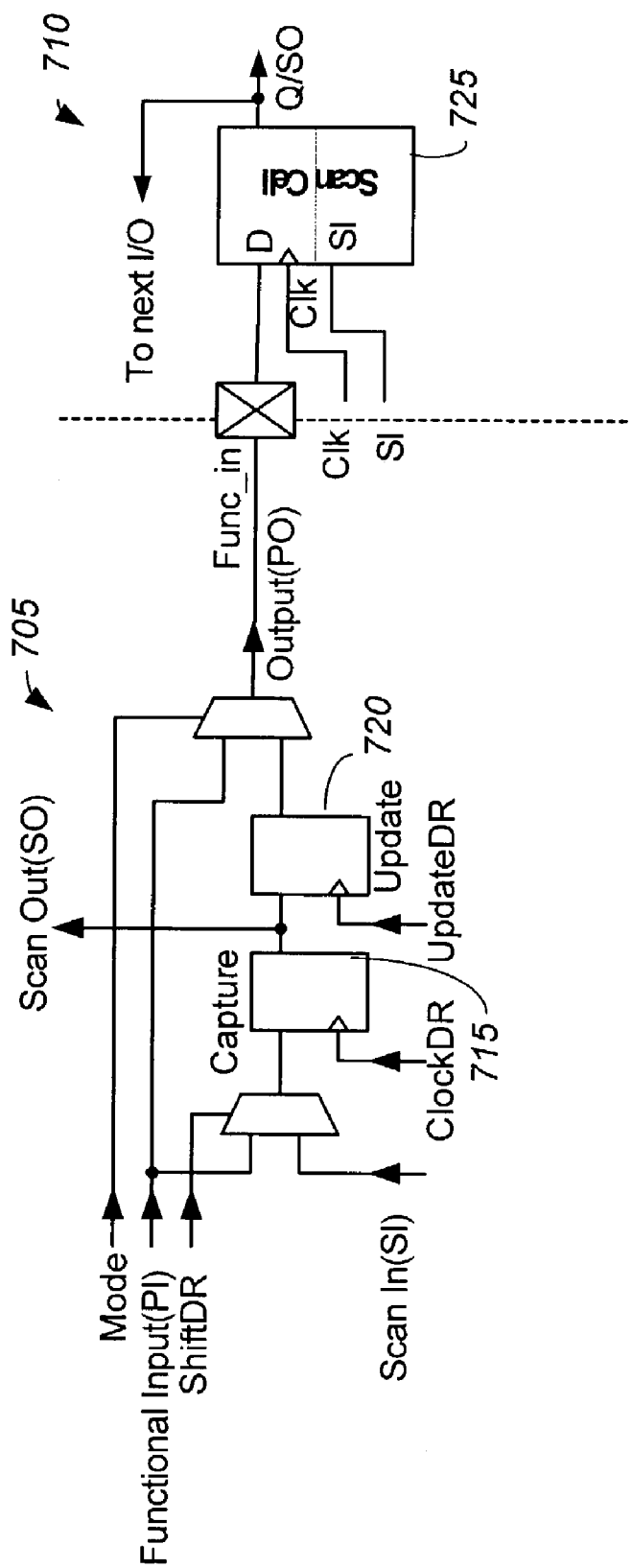
FIG. 7 is a schematic diagram of a boundary scan test (BST) cell and an Automatic Test Pattern Generation (ATPG) cell at a core terminal.

The SoC may include JTAG (BST) scan cells 705 and Automatic Test Pattern Generation (ATPG) scan cells 710, as shown in FIG. 7. The BST scan cell 705 may include a scan in (or serial-in (SI)), data in (or parallel-in (PI)), Shift_DR (data register) and mode (test/normal) inputs and scan out (or serial-out (SO)) and data out (or parallel-out (PO)) outputs. The BST cell 705 may include a capture flip flop 715 and an update flip flop 720. The capture flip flops 715 in BST cells 705 in a scan path may be connected in parallel to form a boundary scan register. During a data register scan operation, test pattern data may be loaded into the capture flip flop 715, which may then be shifted to a neighboring cell in the boundary scan register. At the end of a data register scan operation, an Update_DR signal may be applied which may cause the update flip flop 720 to update (e.g., parallel load) a boundary scan test pattern to the data output (PO).

The ATPG scan cell 710 may include a storage element 720 with inputs for a functional input (D) signal and a scan in (SI) signal. ATPG tests may be used to create a set of patterns which may achieve a given test coverage. An ATPG test may include generating patterns and performing fault simulation to determine which faults the patterns detect. Test patterns, sometimes called test vectors, may be sets of 1's and 0's placed on input terminals during a manufacturing test process to determine if a core is performing properly. A test pattern may be applied and Automatic Test Equipment (ATE) may compare the fault-free output, which may also be contained in the test pattern, with the actual output measured by the ATE.

Figure 8:
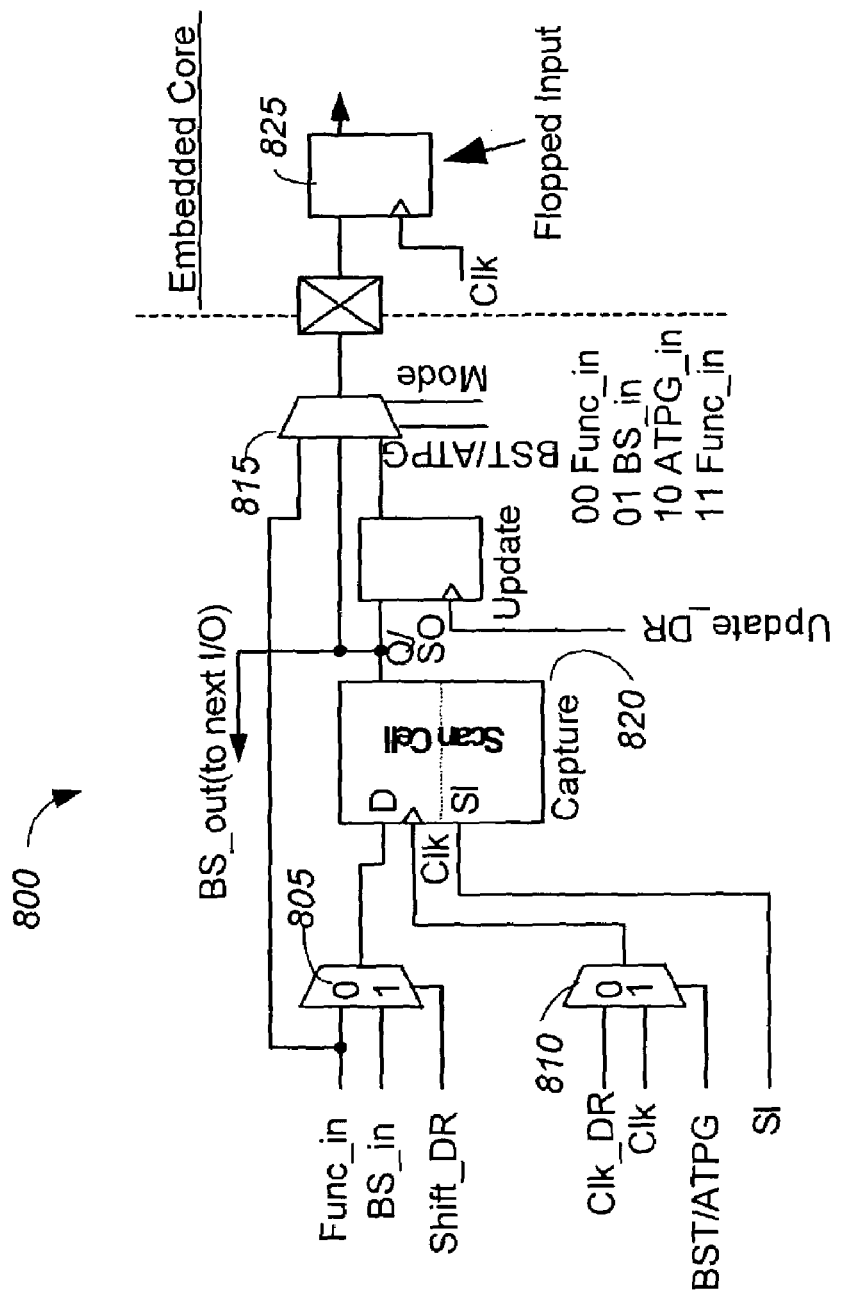
FIG. 8 is a schematic diagram of a dual function BST/ATPG cell according to an embodiment.

FIG. 8 shows a dual-function JTAG (BST)/ATPG scan cell 800 according to an embodiment. The dual function scan cell may include an input MUX 805 controlled by the Shift_DR signal, an input MUX 810 controlled by a BST/ATPG select signal and a 3-input output MUX 815 controlled by a Mode signal and the BST/ATPG signal, although the scope of the present invention is not limited in this respect. An ATPG-type scan cell 820 may be used as the capture flip flop 715. The flip flop 825 at the input of the embedded core may be a part of the core design, and may not present a cost in overhead.

In a first operating mode, the BST/ATPG scan cell 800 may be transparent. The Shift_DR signal may be set to 0 and the Mode and BST/ATPG signals both set to 0 (or both set to 1), which may cause the input MUX 805 and the output MUX 810 to pass the functional input signal to the core terminal. For a JTAG boundary scan test, the Shift_DR and the Mode signals may be set to 1, and the BST/ATPG signal may be set to 0, which may cause the input MUX 805 to select the BS_in signal, the input MUX 810 to select the Clk_DR signal, and the output MUX 815 to select the output of the update flip flop 720. For an ATPG test, the Shift_DR and Mode signals may be set to 0, and the BST/ATPG signal may be set to 1, which may cause the input MUX 805 to select the Func_in signal, the input MUX 810 to select the Clk signal, and the output MUX 815 to select the Q/SO signal, although the scope of the present invention is not limited in this respect.

Figure 9:
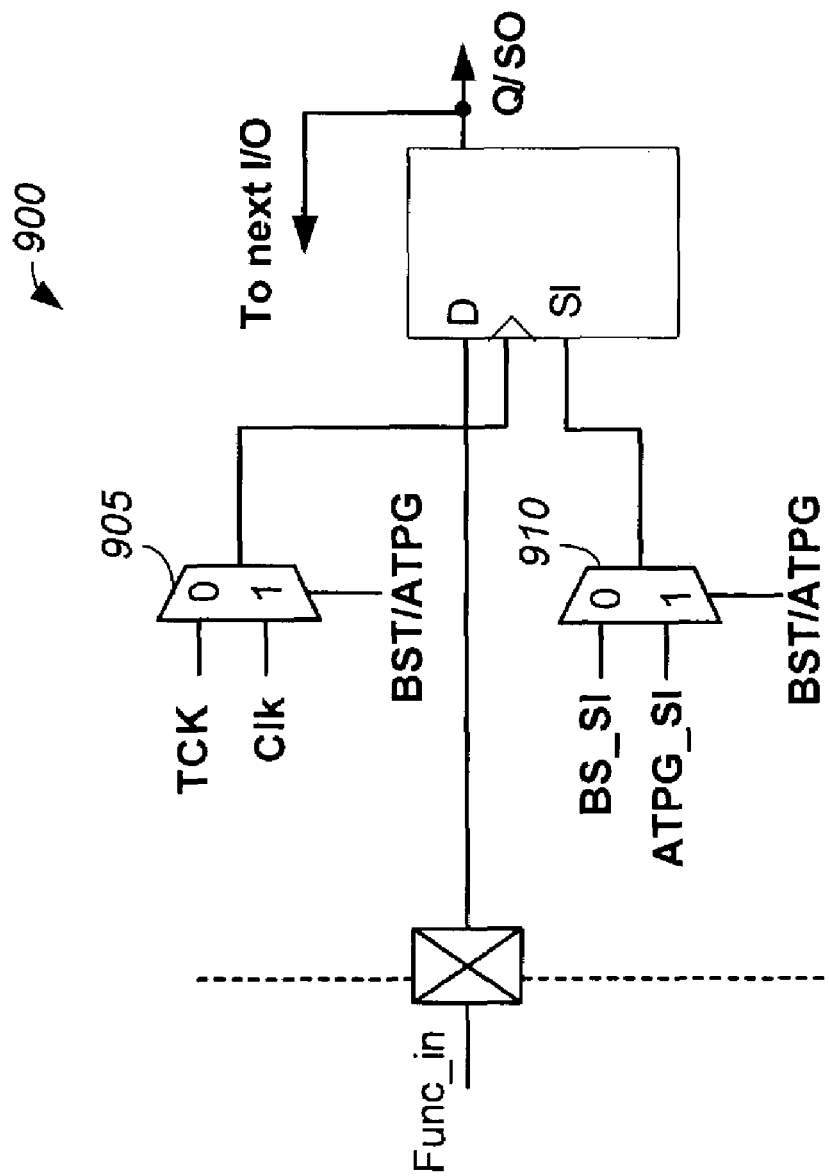
FIG. 9 is a schematic diagram of a dual function BST/ATPG cell according to an alternative embodiment.

FIG. 9 shows a dual-function JTAG (BST)/ATPG scan cell 900 according to an alternative embodiment. The scan cell may include two MUXs controlled by a BST/ATPG select signal: a clock MUX 905 at the clock input and an SI MUX 910 at the SI input. During operation in the first mode and in the ATPG test mode, the scan cell may act like the scan cell 725 shown in FIG. 7. The BST/ATPG signal may be set to 1, which may cause the clock MUX 905 to select the Clk signal and cause the SI MUX 910 to select the ATPG_SI signal.

For the BST (JTAG) test mode, the BST/ATPG signal may be set to 0 during a data register scan operation, which may cause the clock MUX 905 to select the JTAG clock (TCK) signal and the SI MUX 910 to select the BS_SI signal. This may enable the scan cell 900 to capture and shift test pattern data in the scan path. At the end of a data register scan operation, the BST/ATPG signal may be switched to 0, e.g., placed in ATPG test mode. The clock MUX 905 may select the Clk signal and a known test pattern value may be applied to the D input to update the scan cell, although the scope of the present invention is not limited in this respect.

A number of embodiments have been described. Nevertheless, it will be understood that various and scope of the invention. Accordingly, other embodiments are within the scope of the following claims.

The invention claimed is:

1. Apparatus comprising:
   a pipelined memory including multiple stages and a plurality of memory elements having addresses;
   a test module operative to perform a test on the plurality of memory elements by writing test data to the plurality of memory elements in the pipelined memory, redundantly writing said test data n−1 times to the plurality of memory elements, and reading the test data from the plurality of memory elements;
   a first storage unit;
   a comparator to compare test output data that is output from the pipelined memory with data expected to be output from the pipelined memory to identify a failure of a memory element;
   logic to account for a timing latency that arises due to the multiple stages and identify an address of said memory element based on memory addresses of the test data input into the pipelined memory in response to receipt of a notification of the failure from the comparator; and
   a fail trace module operative to interrupt the test in response to the identification of the failure of a memory element and to store the identified address of said memory element in the storage unit thereby making the identified address available for output,
   where n is the number of pipeline stages.

2. The apparatus of claim 1, wherein the test comprises a Built-In Self Test (BIST).

3. The apparatus of claim 1, wherein the memory comprises an embedded memory.

4. The apparatus of claim 1, wherein the test module is operative to perform the test on the plurality of memory elements in a sequence.

5. The apparatus of claim 1 wherein the fail trace module is further operative to restart the test at a next memory element in the sequence.

6. The apparatus of claim 1, further comprising a second storage unit, and wherein the fail trace module is further operative to store a data element stored at the memory element at which the test was interrupted in response to identifying the failure.

7. The apparatus of claim 1, wherein the test module further comprises:
   a pattern generator to generate a test pattern;
   a finite state machine operative to apply said test pattern to the plurality of memory elements; and
   a comparator operative to compare values in the plurality of memory elements with the test pattern.

8. A method comprising:
   writing a test pattern to a plurality of memory elements having addresses in a pipelined memory having multiple stages;
   reading the plurality of memory elements in a sequence, wherein said reading comprises reading the test data from the plurality of memory elements and redundantly reading the test data n−1 times from the plurality of memory elements;
   identifying a fault at one of said memory elements;
   accounting for a timing latency that arises due to the multiple stages and identifying an address of said one of said memory elements based on memory addresses of the test pattern and the identifying of the fault;
   storing the identified address of said one of said memory elements thereby making the identified address available for output; and
   resuming reading the plurality of memory elements at a next memory element in the sequence,
   where n is the number of pipeline stages.

9. The method of claim 8, wherein said identifying comprises:
   comparing data read from the plurality of memory elements to the test pattern; and
   identifying a miscompare between a data element stored in said one of said memory elements and a corresponding data element in the test pattern.

10. The method of claim 9, further comprising: storing the data element stored in said one of said memory elements.

11. The method of claim 8, wherein said writing comprises writing a Built-in Self Test (BIST) test pattern.

12. The method of claim 8, wherein said storing comprises latching the address into a register.

13. The method of claim 8, wherein:
   storing the identified address comprises storing the identified address in a storage unit of a BIST controller; and
   the method further comprises
      repeating the writing of the test pattern, the reading of the plurality of memory elements, the identifying of a fault, the identifying of an address, the storing of the identified address, and the resuming of the reading until the reading of the plurality of memory elements is completed,
      incorporating the identified addresses into a collection of addresses of memory elements, and
      outputting the memory element address collection from the BIST controller.

14. The method of claim 13, wherein incorporating the identified addresses comprises incorporating the identified addresses into a bitmap.

15. A method of testing a pipelined memory, comprising:
- writing test data to a plurality of memory elements in the pipeliried memory;
- redundantly writing said test data n−1 times to the plurality of memory elements;
- reading the test data from the plurality of memory elements;
- identifying an address of a failing memory element based on at least some of the read test data; and
- making the address of a failing memory element available for output,
- where n is the number of pipeline stages.

16. The method of claim 15, further comprising:
- redundantly writing test data for a plurality of read cycles.

17. The method of claim 15, wherein said writing the test data comprises writing a Built-in Self Test (BIST) test pattern.

18. A method of testing a pipelined memory, comprising:
- writing test data to a plurality of memory elements in the pipelined memory;
- reading the test data from the plurality of memory elements; and
- redundantly reading the test data n−1 times from the plurality of memory elements;
- identifying an address of a failing memory element based on at least some of the read test data; and
- making the address of a failing memory element available for output,
- where n is the number of pipeline stages.

19. The method of claim 18, further comprising:
- redundantly reading test data for a plurality of read cycles.

20. The method of claim 18, wherein said writing the test data comprises writing a Built-in Self Test (BIST) test pattern.

* * * * *